United States Patent
Koini et al.

(10) Patent No.: US 11,387,045 B2
(45) Date of Patent: Jul. 12, 2022

(54) MULTILAYER COMPONENT WITH EXTERNAL CONTACT

(71) Applicant: TDK Electronics AG, Munich (DE)

(72) Inventors: Markus Koini, Seiersberg (AT); Thomas Wippel, Stainz (AT); Franz Rinner, Frauental an der Lassnitz (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/976,026

(22) PCT Filed: Feb. 15, 2019

(86) PCT No.: PCT/EP2019/053838
§ 371 (c)(1),
(2) Date: Aug. 26, 2020

(87) PCT Pub. No.: WO2019/166242
PCT Pub. Date: Sep. 6, 2019

(65) Prior Publication Data
US 2020/0411244 A1   Dec. 31, 2020

(30) Foreign Application Priority Data
Feb. 27, 2018  (DE) .......................... 102018104459.3

(51) Int. Cl.
*H01G 4/232*  (2006.01)
*H01G 4/30*   (2006.01)
*H01G 4/38*   (2006.01)

(52) U.S. Cl.
CPC ............. *H01G 4/2325* (2013.01); *H01G 4/30* (2013.01); *H01G 4/385* (2013.01)

(58) Field of Classification Search
None
See application file for complete search history.

(56) References Cited

U.S. PATENT DOCUMENTS

| | | | |
|---|---|---|---|
| 6,208,026 B1 | 3/2001 | Bindig et al. | |
| 6,362,948 B1 * | 3/2002 | Moriwaki | H01G 4/228 361/308.1 |

(Continued)

FOREIGN PATENT DOCUMENTS

| | | | | |
|---|---|---|---|---|
| CN | 101897049 A | * | 11/2010 | ......... H01L 41/0833 |
| CN | 104380405 A | * | 2/2015 | ............... H01G 4/38 |

(Continued)

*Primary Examiner* — Timothy J. Dole
*Assistant Examiner* — Muhammed Azam
(74) *Attorney, Agent, or Firm* — Slater Matsil, LLP

(57) ABSTRACT

A multilayer component is disclosed. In an embodiment, a multilayer component includes a main body with first and second inner electrodes, wherein the first and second electrodes are alternately arranged in an interior of the main body and electrically insulated from one another and an outer contact configured to provide external contact, wherein the outer contact comprises at least two first strip-shaped conductor tracks arranged on a first surface of the main body, wherein each first conductor track is electrically connected to one of the first inner electrodes, wherein the outer contact comprises at least two second strip-shaped conductor tracks arranged on a second surface of the main body, wherein each second conductor track is electrically connected to one of the second inner electrodes, and wherein embossings in adjacent first conductor tracks or second conductor tracks are arranged offset with respect to one another.

15 Claims, 4 Drawing Sheets

(56) References Cited

U.S. PATENT DOCUMENTS

| | | | |
|---|---|---|---|
| 6,507,140 B1 | 1/2003 | Heinz et al. | |
| 6,924,967 B1 * | 8/2005 | Devoe | H01G 2/065 |
| | | | 29/856 |
| 7,331,799 B1 * | 2/2008 | Lee | H05K 3/301 |
| | | | 439/68 |
| 7,739,046 B2 | 6/2010 | Hisashi et al. | |
| 8,289,675 B2 * | 10/2012 | Devoe | H01G 4/38 |
| | | | 361/306.3 |
| 8,339,767 B2 * | 12/2012 | Grimm | H01G 9/06 |
| | | | 361/311 |
| 9,778,847 B2 | 10/2017 | Thomas et al. | |
| 9,780,288 B2 | 10/2017 | Levin et al. | |
| 2006/0270145 A1 * | 11/2006 | Bach | H01L 27/0805 |
| | | | 438/239 |
| 2009/0059467 A1 * | 3/2009 | Grimm | H01G 4/224 |
| | | | 361/301.5 |
| 2009/0323253 A1 | 12/2009 | Kobayashi et al. | |
| 2010/0123995 A1 | 5/2010 | Hideki et al. | |
| 2010/0156251 A1 | 6/2010 | Hohmann et al. | |
| 2011/0169373 A1 | 7/2011 | Nakamura | |
| 2013/0328448 A1 | 12/2013 | Reinhard et al. | |
| 2014/0259655 A1 | 9/2014 | Sato | |
| 2015/0028725 A1 | 1/2015 | Laurent et al. | |
| 2018/0047507 A1 | 2/2018 | Markus et al. | |
| 2020/0118718 A1 | 4/2020 | Wischnat et al. | |

FOREIGN PATENT DOCUMENTS

| | | | | |
|---|---|---|---|---|
| CN | 110710341 A * | 1/2020 | | H01L 23/50 |
| DE | 3629837 A1 * | 3/1988 | | H01G 4/30 |
| DE | 4210847 A1 * | 10/1992 | | H01G 4/30 |
| DE | 19648545 A1 | 5/1998 | | |
| DE | 19928187 C1 | 12/2000 | | |
| DE | 10112588 C1 * | 5/2002 | | H01L 41/293 |
| DE | 102004057795 A1 * | 6/2006 | | H01L 41/0472 |
| DE | 102007015057 A1 * | 10/2007 | | H01L 41/0913 |
| DE | 602005001090 T2 * | 1/2008 | | B32B 18/00 |
| DE | 102005050726 B4 * | 6/2008 | | H01G 4/35 |
| DE | 102008049541 A1 * | 4/2010 | | H01L 41/0472 |
| DE | 102009001416 A1 * | 9/2010 | | H01G 4/38 |
| DE | 102009017434 A1 * | 10/2010 | | H01L 41/293 |
| DE | 102010054589 A1 | 6/2012 | | |
| DE | 202014100666 U1 * | 2/2014 | | H01L 41/1876 |
| DE | 102014223376 A1 * | 12/2015 | | H05K 7/02 |
| DE | 102016107931 A1 | 11/2017 | | |
| DE | 102018104459 A1 * | 8/2019 | | H01G 4/385 |
| DE | 102019218953 A1 * | 6/2021 | | |
| EP | 0302274 A1 * | 2/1989 | | H01G 4/302 |
| EP | 1162671 A2 | 12/2001 | | |
| EP | 1594141 A1 * | 11/2005 | | H01G 4/2325 |
| EP | 1950775 A1 | 7/2008 | | |
| EP | 1981046 A1 * | 10/2008 | | H01G 4/1227 |
| EP | 2043170 A2 * | 4/2009 | | H01L 41/083 |
| EP | 2697845 B1 * | 6/2017 | | H01G 4/228 |
| FR | 2527833 A1 * | 12/1983 | | H01G 4/232 |
| JP | 62134226 U | 8/1987 | | |
| JP | H04179285 A | 6/1992 | | |
| JP | 2001196260 A | 7/2001 | | |
| JP | 2003502870 A | 1/2003 | | |
| JP | 2003124059 A | 4/2003 | | |
| JP | 2005183478 A | 7/2005 | | |
| JP | 4179285 B2 | 11/2008 | | |
| JP | 2010123614 A | 6/2010 | | |
| JP | 2014504010 A | 2/2014 | | |
| JP | 2014220470 A | 11/2014 | | |
| JP | 6121246 B2 | 4/2017 | | |
| JP | 2017191824 A | 10/2017 | | |
| JP | 6316895 B2 | 4/2018 | | |
| KR | 200261551 Y1 | 1/2002 | | |
| WO | WO-0243110 A2 * | 5/2002 | | H01L 41/0472 |
| WO | WO-02073656 A2 * | 9/2002 | | H01L 41/293 |
| WO | 2007118883 A1 | 10/2007 | | |
| WO | WO-2008074305 A1 * | 6/2008 | | H01G 4/2325 |
| WO | WO-2012079988 A1 * | 6/2012 | | H01L 41/083 |
| WO | WO-2012099121 A1 * | 7/2012 | | B32B 7/06 |
| WO | 2013011217 A1 | 1/2013 | | |
| WO | 2016080350 A1 | 5/2016 | | |

* cited by examiner

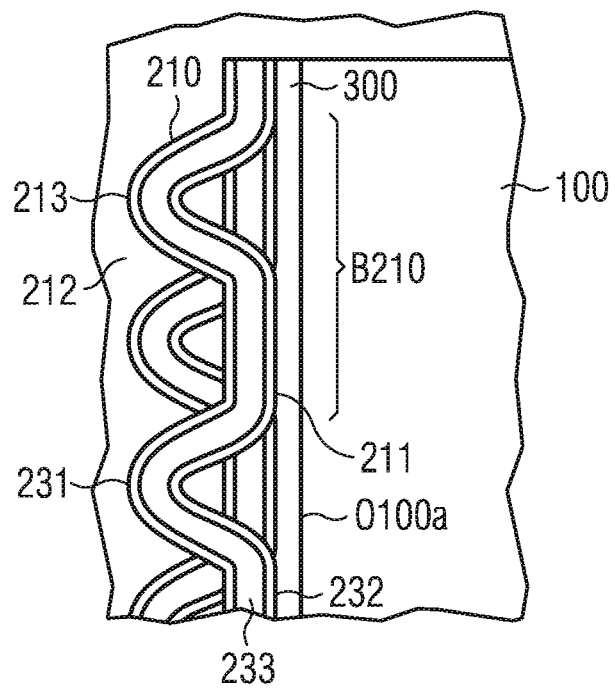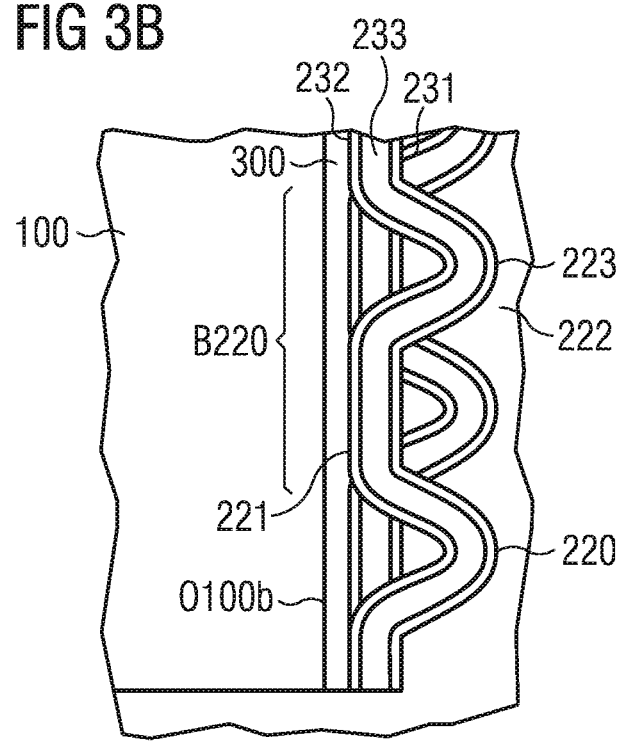

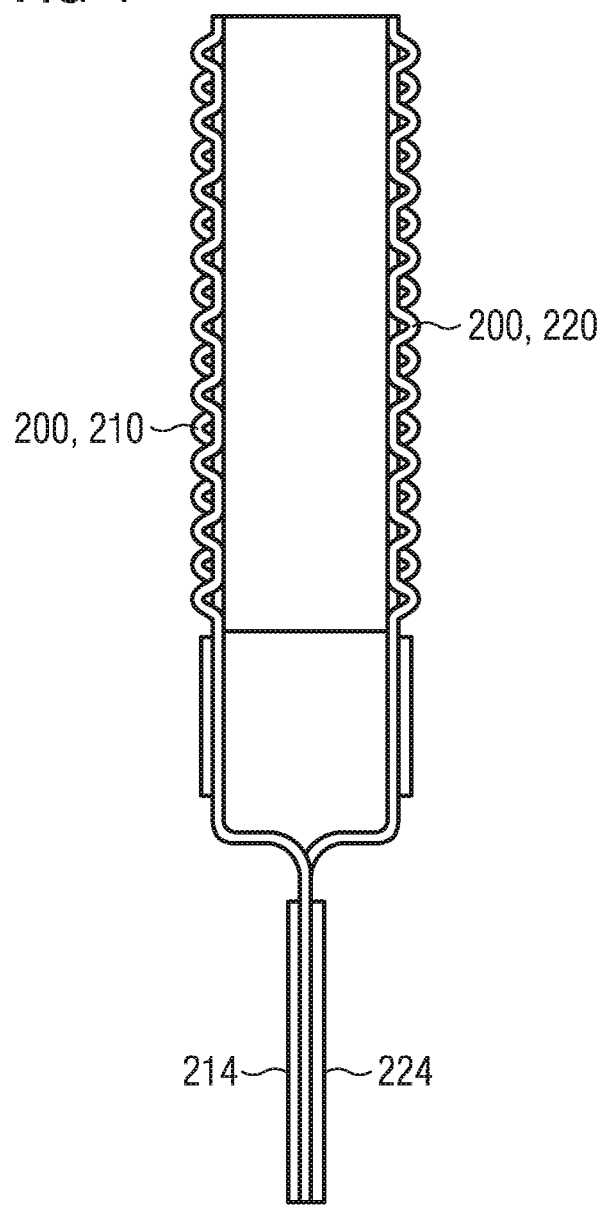

MULTILAYER COMPONENT WITH EXTERNAL CONTACT

This patent application is a national phase filing under section 371 of PCT/EP2019/053838, filed Feb. 15, 2019, which claims the priority of German patent application 102018104459.3, filed Feb. 27, 2018, each of which is incorporated herein by reference in its entirety.

TECHNICAL FIELD

The invention relates to a multilayer component, in particular a ceramic block capacitor, with an outer contact for making contact with inner electrodes of the multilayer component.

SUMMARY

A multilayer component can be embodied for example as a ceramic capacitor, in particular as a power capacitor. A multilayer component of this type comprises a main body composed of a piezoelectric material, in which inner electrode layers are arranged. The inner electrode layers are led out alternately at different sides of the main body. In order to apply a voltage to the electrode layers from outside, a contact must be provided.

The main body of the multilayer component has a piezoelectric expansion besides a thermal expansion when a voltage is applied to the inner electrodes. The piezoelectric material of the main body usually expands in the stacking direction in which the electrode layers are stacked in the interior of the main body, and contracts in the plane of the inner electrodes. The contact of the multilayer component must be constituted in such a way that the thermal expansion differences that occur between the piezoelectric ceramic of the main body and the outer contact and also the piezoelectric expansion of the piezoelectric ceramic only slightly impair the fatigue strength of the multilayer component.

Furthermore, the multilayer component and in particular the outer contact are intended to have a high current-carrying capacity, for example of a few hundred amperes. Furthermore, the multilayer component and in particular the outer contact are intended to have a high thermal stability at high temperatures, for example of up to approximately 200° C.

Embodiments provide a multilayer component with an external contact in which the outer contact has a high current-carrying capacity and a high thermal stability and in which thermal expansion differences between the material of a main body of the multilayer component and the outer contact and also the piezoelectric expansion of the main body influence the fatigue strength of the multilayer component only to a small extent.

One embodiment of a multilayer component with an outer contact having a high current-carrying capacity and also a high thermal stability and a good thermal expansion matching of the outer contact to the material of the main body of the multilayer component is specified in patent claim 1.

In accordance with one possible embodiment, the multilayer component comprises a main body with first and second inner electrodes, which are arranged in the interior of the main body alternately and in a manner electrically insulated from one another, and with an outer contact for making external contact with the inner electrodes. The outer contact comprises at least two first strip-shaped conductor tracks arranged on a first surface of the main body. The first conductor tracks are each electrically connected to one of the first inner electrodes. Furthermore, the outer contact comprises at least two second strip-shaped conductor tracks arranged on a second surface of the main body. The second surface of the main body is situated opposite to the first surface of the main body. The second conductor tracks are each electrically connected to one of the second inner electrodes.

The first conductor tracks are mechanically decoupled from the second inner electrodes, and the second conductor tracks are mechanically decoupled from the first inner electrodes.

The main body can be formed from a piezoelectric material, for example from a PLZT (Lead Lanthanum Zirconate Tritanate) ceramic.

In accordance with one embodiment of the multilayer component, the first strip-shaped conductor tracks are arranged in a manner spaced apart from one another on the first surface of the main body. The second conductor tracks are arranged in a manner spaced apart from one another on the second surface of the main body. Such a strip-shaped arrangement of the first and second conductor tracks on opposite surfaces of the multilayer component results in two-dimensional load relief for the outer contact, such that piezomechanical movements of the main body only slightly influence the stability of the outer contact.

Furthermore, a specific shaping of the first and second conductor tracks can ensure that the remaining expansion differences between the material of the main body of the multilayer component and the first and second conductor tracks of the outer contact are compensated for by a bending of the first and second conductor tracks. For this purpose, the first and second conductor tracks each have first area portions secured to a respective surface of the main body, and each have second area portions arranged in a manner spaced apart from the first and second surface, respectively, of the main body. The respective second area portions of the first and second conductor tracks can have an embossing or bulge directed away from the first and second surface, respectively, of the main body. The embossings in the individual strip-shaped conductor tracks ensure that the first and second conductor tracks can follow a thermal and/or piezoelectric expansion of the main body, without the outer contact being damaged.

In order to ensure a high current-carrying capacity of the outer contact, the first and second conductor tracks can each be embodied as a sufficiently thick composite sheet (CIC composite sheet) composed of a first and second ply composed of copper, between which a third ply composed of Invar is arranged. In accordance with one advantageous configuration, the copper/Invar/copper composite sheet has a thickness ratio of 20% of its first and second plies composed of copper and 60% of the third ply composed of Invar.

By virtue of an embodiment of the outer contact as a CIC composite sheet having a thickness ratio of the first ply composed of copper, the middle ply composed of Invar and the second ply composed of copper as 20/60/20, the coefficient of lateral thermal expansion of the CIC composite sheet of 7 to 8 ppm/K is well matched to the coefficient of lateral thermal expansion of the main body, for example of a PLZT (Lead Lanthanum Zirconate Tritanate) ceramic, of approximately 8 to 10 ppm/K.

Providing a specific connection layer between the main body and the first and second conductor tracks enables the thermal stability of the outer contact to be improved further. A sintering silver technology can be used to produce the connection layer. This connection technique is very stable thermomechanically and in regard to thermal cycles.

A porous layer composed of silver, a so-called sintering silver layer, can be arranged as connection layer between the main body and the first and second conductor tracks. The high thermal stability of the outer contact is ensured by the connection of the first and second conductor tracks to a sputtering layer arranged on the surface of the ceramic main body by means of the porous connection layer composed of silver.

BRIEF DESCRIPTION OF THE DRAWINGS

The invention is explained in greater detail below with reference to figures, which show exemplary embodiments of the present invention.

FIG. 3A shows an enlarged illustration of an embodiment of an outer contact on a first surface of a main body of a multilayer component;

FIG. 3B shows an enlarged illustration of an embodiment of an outer contact on a second surface of a main body of a multilayer component; and FIG. 4 shows a transverse view of an embodiment of a multilayer component with an external contact.

DETAILED DESCRIPTION OF ILLUSTRATIVE EMBODIMENTS

Figure 1:
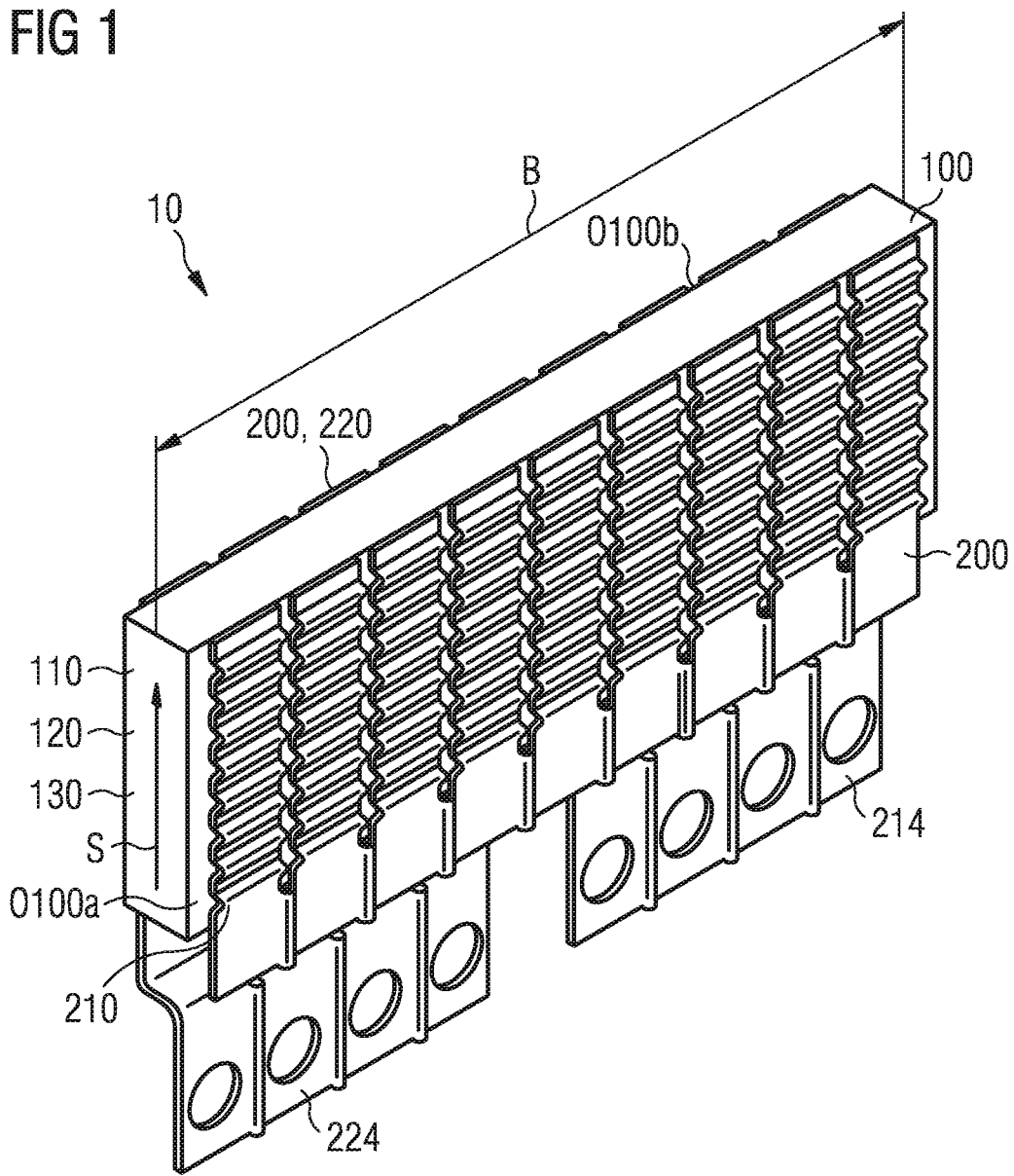
FIG. 1 shows an embodiment of a multilayer component with external contact of the inner electrodes in a perspective illustration of a first surface of the multilayer component.
Figure 2:
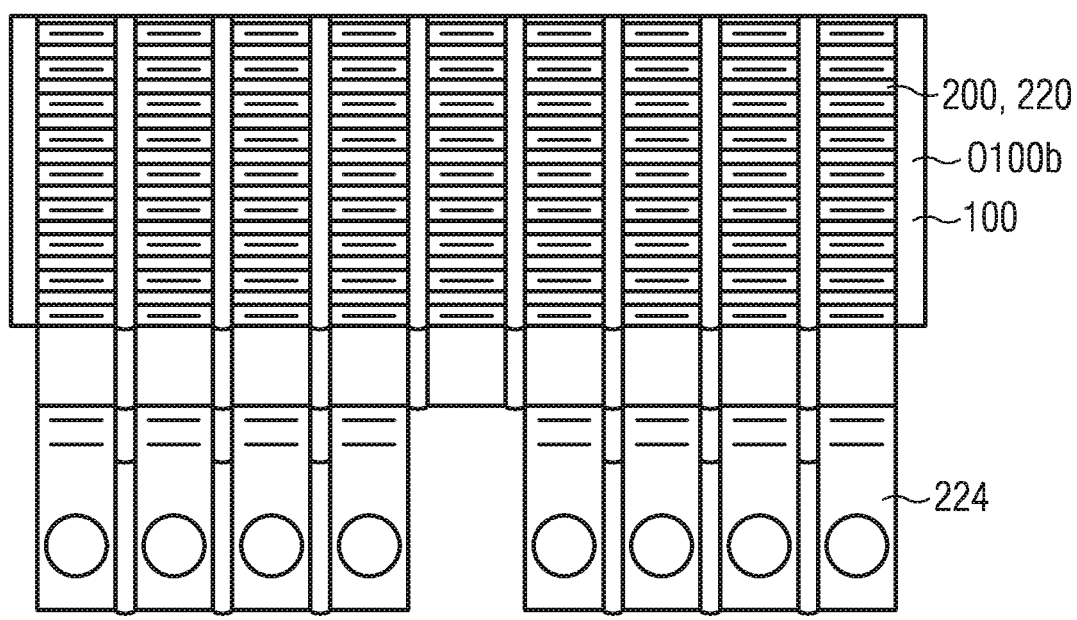
FIG. 2 shows a plan view of a second surface of a multilayer component with external contact of the inner electrodes.

FIG. 1 shows a perspective illustration of a multilayer component 10. FIG. 1 illustrates in particular a perspective view of a first surface O100a of a main body 100 of the multilayer component 10. FIG. 2 shows a plan view of an opposite second surface O100b of the main body 100 of the multilayer component 10. The multilayer component 10 can be embodied for example as a capacitor, for example as a ceramic block capacitor (Ultrabar).

The multilayer component 10 comprises a main body 100 with first and second inner electrodes 110, 120, which are arranged in the interior of the main body 100 alternately and in a manner electrically insulated from one another. The main body 100 comprises in particular a piezoelectric material 130, which exhibits an expansion when a voltage is applied. The first and second inner electrodes 110 and 120 are arranged alternately in a stacking direction S in the piezoelectric material 130. The piezoelectric material 130 is arranged in particular in each case between one of the first inner electrodes 110 and one of the second inner electrodes 120.

The multilayer component 10 comprises an outer contact 200 for making external contact with the inner electrodes 110 and 120. The outer contact 200 comprises at least two first strip-shaped conductor tracks 210 arranged on the first surface O100a of the main body 100. The first conductor tracks 210 are each electrically connected to one of the first inner electrodes 110. The first conductor tracks 210 are mechanically decoupled from the second inner electrodes 120. Furthermore, the outer contact 200 comprises at least two second strip-shaped conductor tracks 220 arranged on the second surface O100b of the main body 100, as is shown in FIG. 2. The second conductor tracks 220 are each electrically connected to one of the second inner electrodes 120. The second conductor tracks 220 are mechanically decoupled from the first inner electrodes 110.

As is illustrated in FIG. 1, the first conductor tracks 210 are arranged in strip-shaped fashion and in a manner spaced apart from one another on the first surface O100a of the main body 100. FIG. 2 shows the second conductor tracks 220 arranged in strip-shaped fashion and in a manner spaced apart from one another on the second surface O100b of the main body 100. By virtue of such a strip-shaped arrangement of the first and second conductor tracks 210, 220 on the first and second surfaces of the main body 100, in particular a change in length of the main body in the direction of the width B of the main body 100 can be compensated for, without damage to the outer contact 200 occurring in the event of such an expansion of the main body.

The main body 100 of the multilayer component can comprise a ceramic material, for example a PLZT ceramic. The ceramic main body (ceramic bar) can have a depth of 7 mm, a height of 27 mm and a width of 80 mm. In accordance with one possible, advantageous embodiment, the plurality of strip-shaped conductor tracks 210 and 220 each have a width of between 6 mm and 8 mm, preferably approximately 7 mm.

FIG. 3A shows a cross section of a part of the multilayer component 10 with a part of the outer contact 200 arranged on the first surface O100a of the main body 100. FIG. 3B shows a part of the multilayer component 10 with that part of the outer contact 200 which is arranged on the second surface O100b of the main body 100.

In accordance with one embodiment of the multilayer component, the first conductor tracks 210 each have first area portions 211 secured to the first surface O100a of the main body 100. Furthermore, the first conductor tracks 210 each have second area portions 212 arranged in a manner spaced apart from the first surface O100a of the main body 100. In a manner corresponding to the first conductor tracks, the second conductor tracks 220 also each have first area portions 221 secured to the second surface O100b of the main body 100. Furthermore, the second conductor tracks 220 each have second area portions 222 arranged in a manner spaced apart from the second surface O100b of the main body 100.

As is illustrated in FIG. 3A, the first area portions 211 of the first conductor tracks 210 are each arranged parallel to the first surface O100a of the main body 100. The second area portions 212 of the first conductor tracks 210 each have an embossing or bulge 213 directed away from the first surface O100a of the main body 100.

As is illustrated in FIG. 3B, the first area portions 221 of the second conductor tracks 220 are each arranged parallel to the second surface O200b of the main body 100. The second area portions 222 of the second conductor tracks 220 each have an embossing or bulge 223 directed away from the second surface O100b of the main body 100.

In accordance with one possible embodiment of the multilayer component, a region B210 of the first conductor tracks 210 that contains one of the first area portions 211 and one of the second area portions 212 is embodied in such a way that the first area portions 211 comprises approximately two thirds of the length of the region B210 of the first conductor tracks 210 and the second area portion 212 comprises approximately one third of the length of the region B210 of the first conductor tracks 210.

Referring to FIG. 3B, correspondingly a region B220 of the second conductor tracks 220 that contains one of the first area portions 221 and one of the second area portions 222 can be embodied in such a way that the first area portions 221 comprises approximately two thirds of the length of the region B220 of the second conductor tracks 220 and the second area portion 222 comprises approximately one third of the length of the region B220 of the second conductor tracks 220.

As can be discerned from FIGS. 3A and 3B, the first area portion 211 of the first conductor tracks 210 that is fixed on the first surface O100*a* of the main body 100 and respectively the first area portion 221 of the second conductor tracks 220 that is fixed on the second surface O100*b* of the main body 100 can each have a length of 2 mm. The second area portions 212 of the first conductor tracks 210 that are embodied in each case as an embossing or bulge 213 directed away from the first surface O100*a* of the main body 100 and respectively the second area portions 222 of the second conductor tracks 220 that are embodied in each case as an embossing or bulge 223 directed away from the second surface O100*b* of the main body 100 have a length of 1 mm, for example. The embossings/bulges 213, 223 of the second area portions 212, 222 of the first and second conductor tracks 210, 220 can have a depth of approximately 1 mm, for example.

In accordance with one possible embodiment, the embossings 213 of the first strip-shaped conductor tracks 210 in adjacent first conductor tracks 210 are arranged offset with respect to one another. As can be discerned in FIG. 3A, the embossings 213 on adjacent strips of the first conductor tracks 210 are arranged for example with an offset of 1.5 mm with respect to one another.

The embossings 223 of the second strip-shaped conductor tracks 220 in adjacent second conductor tracks 220 can be arranged offset with respect to one another. FIG. 3B shows the offset of the embossings 223 in second strip-shaped conductor tracks 220 arranged next to one another. As can be discerned in FIG. 3B, the embossings 223 on adjacent strips of the second conductor tracks 220 are arranged for example with an offset of 1.5 mm with respect to one another.

By virtue of the first conductor tracks 210 arranged next to one another being arranged offset with respect to one another and by virtue of second conductor tracks 220 arranged next to one another being arranged offset with respect to one another, a reliable contact of all inner electrodes of the multilayer component can be achieved.

By virtue of the fact that in each of the strip-shaped conductor tracks approximately two thirds of the length of the conductor tracks, for example 2 mm of the length of the strip-shaped conductor tracks 210, 220, is secured to the first and second surface O100*a*, O100*b*, respectively, of the main body 100 and only one third of the length of the strip-shaped conductor tracks 210, 220 has an embossing 213, 223, the strip-shaped conductor tracks can expand in the stacking direction S depicted in FIG. 1 if the piezoelectric main body 100 expands when a voltage is applied to the inner electrodes, without damage to the outer contact 200 occurring.

As can be discerned in FIG. 3A, each of the second area portions 212 of the first conductor tracks 210 is arranged between two of the first area portions 211 of the first conductor tracks 210. Each of the first area portions 211 of the first conductor tracks 210 is arranged between two of the second area portions 212 of the first conductor tracks 210. Correspondingly, each of the second area portions 222 of the second conductor tracks 220 is arranged between two of the first area portions 221 of the second conductor tracks 220. Each of the first area portions 221 of the second conductor tracks 220 is arranged between two of the second area portions 222 of the second conductor tracks 220.

In accordance with one possible embodiment shown in FIGS. 3A and 3B, the first conductor tracks 210 and the second conductor tracks 220 can be embodied in each case as a composite sheet composed of a first ply 231 composed of copper and a second ply 232 composed of copper. A third ply 233 composed of Invar is arranged between the first and second plies 231, 232. The composite sheet can have for example a thickness ratio of 20/60/20, that is to say a thickness ratio of 20% of the first ply 231 composed of copper, 60% of the third ply 233 composed of Invar and 20% of the second ply 232 composed of copper.

Such a copper/Invar/copper (CIC) composite sheet ensures a high current-carrying capacity of the outer contact, which can be a few 100 A, for example. Furthermore, in the case of such a construction of the composite sheet having a thickness ratio of 20/60/20 of the first ply 231 composed of copper, the third ply 233 composed of Invar and the second ply 232 composed of copper, the coefficient of lateral thermal expansion of the CIC composite sheet is well matched to the coefficient of lateral thermal expansion of the main body 100, for example of a PLZT ceramic. In the case of the embodiment shown in FIGS. 3A and 3B, the first and second conductor tracks 210, 220 respectively have for example a total thickness of 0.7 mm, wherein the third ply 233 composed of Invar has a thickness of 0.42 mm.

In accordance with one possible embodiment, a porous layer composed of silver (sintering silver) can be provided as a connection layer 300 between the main body 100 and the first conductor tracks 210 and respectively the second conductor tracks 220. Such a connection layer ensures the thermal stability of the outer contact 200 to the main body 100 since the porous connection layer 300, on account of its spongy structure, is very flexible with regard to a different expansion of the main body 100 and of the outer contact 200.

In order to connect the outer contact 200, that is to say the first and second strip-shaped conductor tracks 210, 220, to the first surface O100*a* and the second surface O100*b*, respectively, of the main body 100, a thin, metallized layer can be applied to the first surface O100*a* and the second surface O100*b*, respectively, of the main body 100. The thin, metallized layer can be a layer arrangement composed of chromium-nickel-silver, for example. By way of example, a thin layer composed of chromium, for example a chromium layer having a thickness of 0.3 μm, is applied as an adhesion promoter directly to the piezoelectric ceramic of the main body 100. Above that a nickel layer having for example a thickness of likewise approximately 0.3 μm is applied as a diffusion barrier. A silver layer, which can have a thickness of 0.5 μm, for example, is subsequently applied to the nickel layer. The layer arrangement composed of chromium-nickel-silver can be applied as a sputtering layer to the first surface O100*a* and the second surface O100*b*, respectively, of the main body.

A silver layer can be applied, for example electrolytically, to the underside of the first conductor tracks 210 and of the second conductor tracks 220, respectively, in particular to the underside of the respective CIC composite sheets. The silver layer of the chromium-nickel-silver layer arrangement and the silver layer on the underside of the respective CIC composite sheet of the first and second conductor tracks are subsequently sintered in a sintering process to form a porous silver layer. Said porous silver layer forms the connection layer 300. A porous silver sponge thus arises between the nickel layer, the chromium-nickel-silver layer arrangement and the copper layer 231 of the first and second conductor tracks 210, 220, said silver sponge having a good electrical conductivity and, on account of its flexibility, not being damaged in the event of a piezoelectric expansion of the main body 100 and/or on account of a different thermal expansion behavior between the main body 100 and the outer contact 200. Hardly any degradation effects are ascertainable even after long thermal cycles.

FIG. 4 shows a cross section of the multilayer component 10. Each of the first conductor tracks 210 has a contact portion 214 for making contact with the respective first conductor tracks 210. Likewise, each of the second conductor tracks 220 has a contact portion 224 for making contact with the respective second conductor tracks 220. The contact portions 214 and 224 are also shown in FIGS. 1 and 2.

In the embodiment of the multilayer component 10 shown in FIG. 4, the contact portions 214 of the first conductor tracks 210 and the contact portions 224 of the second conductor tracks 220 are bent in such a way that the contact portions 214 and 224 of the first and second conductor tracks 210 and 220 lie in one plane. This enables the contact portions 214, 224 to be screwed on a flat connection contact in a flush manner. For screwing the outer contact 200 to a connection contact, contact holes 215 are provided in the contact portions 214 of the conductor tracks 210 and contact holes 225 are provided in the contact portions 224 of the conductor tracks 220.

In the embodiment of the multilayer component 10 shown in FIG. 4, the contact portions 214 and 224 are arranged centrally with respect to the main body 100, for example. The screwing location is aligned centrally with the bar/main body 100. In order to enable flush screwing on a flat contact, it is necessary partly to rotate the direction of the notches for one of the first and second conductor tracks. Instead of the central arrangement of the contact portions 214 and 224 as shown in FIG. 4, in another possible embodiment of the multilayer component the contact portions can be offset laterally in relation to the center of the main body.

The invention claimed is:

1. A multilayer component comprising:
a main body with first and second inner electrodes, wherein the first and second inner electrodes are alternately arranged in an interior of the main body and electrically insulated from one another; and
an outer contact configured to provide external contact, wherein the outer contact comprises at least two first strip-shaped conductor tracks arranged on a first surface of the main body,
wherein each first strip-shaped conductor track is electrically connected to one of the first inner electrodes,
wherein the outer contact comprises at least two second strip-shaped conductor tracks arranged on a second surface of the main body,
wherein each second strip-shaped conductor track is electrically connected to one of the second inner electrodes, and
wherein embossings in adjacent first strip-shaped conductor tracks or second strip-shaped conductor tracks are arranged offset with respect to one another.

2. The multilayer component according to claim 1, wherein the first strip-shaped conductor tracks are mechanically decoupled from the second inner electrodes, and
wherein the second strip-shaped conductor tracks are mechanically decoupled from the first inner electrodes.

3. The multilayer component according to claim 1, wherein the first strip-shaped conductor tracks are spaced apart from one another on the first surface of the main body, and
wherein the second strip-shaped conductor tracks are spaced apart from one another on the second surface of the main body.

4. The multilayer component according to claim 1, wherein each first strip-shaped conductor track has first area portions secured to the first surface of the main body,
wherein each first strip-shaped conductor track has second area portions arranged in a manner spaced apart from the first surface of the main body,
wherein each strip-shaped second conductor track has first area portions secured to the second surface of the main body, and
wherein each strip-shaped second conductor track has second area portions arranged in a manner spaced apart from the second surface of the main body.

5. The multilayer component according to claim 4, wherein each first area portion of the first strip-shaped conductor tracks is arranged parallel to the first surface of the main body,
wherein each first area portion of the second strip-shaped conductor tracks is arranged parallel to the second surface of the main body,
wherein each second area portion of the first strip-shaped conductor tracks has an embossing directed away from the first surface of the main body, and
wherein each second area portion of the second strip-shaped conductor tracks has an embossing directed away from the second surface of the main body.

6. The multilayer component according to claim 5, wherein the embossings in adjacent first strip-shaped conductor tracks are arranged offset with respect to one another, and
wherein the embossings in adjacent second strip-shaped conductor tracks are arranged offset with respect to one another.

7. The multilayer component according to claim 4, wherein each second area portion of the first and second strip-shaped conductor tracks is arranged between two of the first area portions of the first and second strip-shaped conductor tracks.

8. The multilayer component according to claim 4, wherein a region of the first and second strip-shaped conductor tracks that contains one of the first area portions and one of the second area portions is embodied in such a way that one of the first area portions comprises two thirds of a length of the region of the first and second strip-shaped conductor tracks and one of the second area portions comprises one third of the length of the region of the first and second strip-shaped conductor tracks.

9. The multilayer component according to claim 1, wherein the main body comprises a piezoelectric material, wherein the first and second inner electrodes are arranged alternately in a stacking direction in the piezoelectric material, and
wherein each piezoelectric material is arranged between one of the first inner electrodes and one of the second inner electrodes.

10. The multilayer component according to claim 9, wherein the first strip-shaped conductor tracks are arranged on the first surface of the main body in such a way that a respective longitudinal direction of the first strip-shaped conductor tracks is arranged in the stacking direction, and
wherein the second strip-shaped conductor tracks are arranged on the second surface of the main body in such a way that a respective longitudinal direction of the second strip-shaped conductor tracks is arranged in the stacking direction.

11. The multilayer component according to claim 1,
wherein each of the first strip-shaped conductor tracks has a contact portion for making contact with the respective first strip-shaped conductor track,
wherein each of the second strip-shaped conductor tracks has a contact portion for making contact with the respective second strip-shaped conductor track, and
wherein the contact portions of the first strip-shaped conductor tracks and the contact portions of the second strip-shaped conductor tracks are bent in such a way that the contact portions of the first and second strip-shaped conductor tracks lie in one plane.

12. The multilayer component according to claim 1, wherein the first strip-shaped conductor tracks and the second strip-shaped conductor tracks are a composite sheet composed of a first and a second ply composed of copper, between which a third ply composed of Invar is arranged.

13. The multilayer component according to claim 12, wherein the composite sheet has a thickness ratio of 20% of the first and second plies composed of copper and 60% of the third ply composed of Invar.

14. The multilayer component according to claim 1, further comprising a porous layer composed of silver arranged as a connection layer between the main body and the first and second strip-shaped conductor tracks.

15. The multilayer component according to claim 1, wherein the multilayer component is a capacitor.

\* \* \* \* \*